United States Patent [19]

Spain et al.

[11] Patent Number: 5,658,441
[45] Date of Patent: Aug. 19, 1997

[54] CONVEYORIZED SPRAY PLATING MACHINE

[75] Inventors: Robert J. Spain, Newton; Steven P. Glassman, Randolph, both of Mass.

[73] Assignee: CFC, Inc., Waltham, Mass.

[21] Appl. No.: 572,872

[22] Filed: Dec. 18, 1995

[51] Int. Cl.⁶ .................................................. C25D 17/00
[52] U.S. Cl. ..................... 204/203; 204/224 R; 204/225
[58] Field of Search ................. 204/203, 224 R, 204/225, 198, 199–200, 215; 205/133

[56] References Cited

U.S. PATENT DOCUMENTS

| 4,377,461 | 3/1983 | Lovejoy | 204/198 |
|---|---|---|---|
| 4,409,071 | 10/1983 | Dibble et al. | 205/133 |
| 4,425,212 | 1/1984 | Francis | 204/224 R X |
| 4,427,520 | 1/1984 | Bahnsen et al. | 204/224 R |
| 4,576,685 | 3/1986 | Goffredo et al. | 204/198 |
| 4,610,772 | 9/1986 | Palnik | 204/224 R X |
| 4,755,271 | 7/1988 | Hosten | 204/198 |
| 4,772,361 | 9/1988 | Dorsett et al. | 204/224 R X |
| 5,114,558 | 5/1992 | Kadija | 204/224 R |
| 5,141,602 | 8/1992 | Chen et al. | 205/103 |
| 5,453,174 | 9/1995 | Van Anglen et al. | 204/224 R X |

*Primary Examiner*—Donald R. Valentine
*Attorney, Agent, or Firm*—Lahive & Cockfield, LLP

[57] ABSTRACT

An apparatus for spraying electroplating of metal onto a panel surface that moves through a plating chamber employs roller brushes positioned between electrolyte spray heads and the panel. Metal anodes are positioned to contact the fluffy, absorbent outer layer of the roller brushes while they are being wet by the electrolyte to provide for electrical contact between the anodes and the panel being plated. A suitable power supply has its positive terminal connected to the anodes and its negative terminal connected to the moving panel.

10 Claims, 3 Drawing Sheets

5,658,441

CONVEYORIZED SPRAY PLATING MACHINE

FIELD OF THE INVENTION

This invention relates in general to apparatus for providing a conveyorized plating machine and, more particularly, to provide a copper plating spray chamber in which printed circuit panels to be plated are conveyed continuously through a chamber in which electrolyte is sprayed onto the panels in conjunction with the application of electrical current for plating copper metal onto the panels as they pass through the chamber on the moving conveyor.

BACKGROUND OF THE INVENTION

In the printed circuit board industry many of the processing steps for manufacturing the circuit boards have been automated, most usually by conveyorizing processing machinery. The use of automated conveyor-based processing provides for reduced labor, unattended operation and, importantly, produces a more uniform manufacturing result since every article processed passes through the same plating environment and steps as it is conveyed through the machine. Up to the present time, however, apparatus for electroplating circuit boards has not included a system in which spray electroplating, with its attendant uniformity, controllability of plating, and improved efficiency by means of the aggressive and constant spraying of fresh electrolyte has been available in a continuous processing operation. Conveyorized machines using flooded, electrolyte-filled chambers are in some use but are more complex and costly to build and less efficient in plating operation when compared to tests carried out on the machine which is the subject of this patent application. Most automated plating systems currently available consist of machinery for carrying racks of pc board panels through a series of baths or tanks containing electrolyte in order to accomplish the plating. These racks are manually loaded and unloaded and do not provide as continuous an operation as the loading and unloading of panels on a moving conveyor. Their trolley and hoist type of configuration is less compatible with the trend toward horizontal conveyorized equipment.

While continuous or semi-continuous conveying of plate-like objects to be plated in whole or in part has been carried out with endless conveyors, this is employed in dip baths or the like for the basic plating mechanism. In conventional plating baths, electrical contact is easily provided by connecting the electrodes of an appropriate power supply with both the metal anodes and the racks carrying the panels, and the electrical current is thereby carried through the electrolyte bath. The bath arrangement, however, is characterized by disadvantage with respect to the spray of electrolyte, in that with spraying there is a constant mover of fresh electrolytes with consequent significantly higher plating current densities resulting in an improved time efficiency of the process.

It is therefore an object of this invention to provide an apparatus and process for substantially continuously processing of printed circuit boards through a spray plating chamber in which electrolyte is sprayed onto the panels to be plated and which includes sufficiently high currents to be passed between the anode and the panels serving as cathodes to achieve high plating current density.

It is another object of the invention to provide a spray electrolyte plating system for printed circuit panels which provides uniformity of plating density on the panels.

SUMMARY OF THE INVENTION

The present invention apparatus provides for spray plating specific metal onto surfaces of a panel, such as a printed circuit board, at high current densities with the panels being moved substantially continuously by a transport mechanism. This is achieved by positioning a series of roller brushes between the panels and the spray heads in a configuration such that electrolyte is sprayed from the spray heads onto metal anodes with the roller brush contacting, on one side, the anodes and, on the other, the panels to be plated. The anodes are maintained at a positive potential while the panels are at a negative potential with respect to the anode potential. Since the electrolyte spray maintains the brushes in a wet condition with a fluffy roller covering carrying the electrolyte, electrolytic action between the wetted brush and the anodes (for example, copper anodes) provides for a carrying of metallic atoms and electrolyte through the brushes to the panel. Because of the physical arrangement, a high current density can be employed providing for a high efficiency process. One significant departure of this invention from the prior art is the employment of the brushes wetted with the electrolyte to carry the metal onto a panel which is continuously moving. As described below, there are preferred embodiments of this invention, and particular configurations of anodes and roller brushes, as well as varying types of transport mechanisms. Additionally, and importantly, tests of the apparatus indicate that the rubbing or shadowing action of the brush rollers against the moving panels makes preferential electroplating occur within the holes as compared to the panel surface which is a desirable feature often referred to as "high throwing power".

BRIEF DESCRIPTION OF THE DRAWINGS

FIG. 1b is a cross sectional view of the roller structure of FIG. 1a;

DESCRIPTION OF PREFERRED EMBODIMENT

Figure 3:
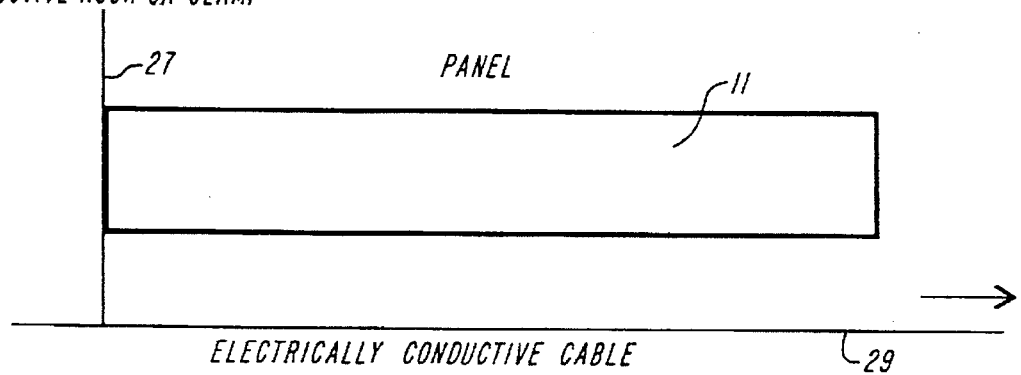
FIG. 3 is an illustration of one method for providing electrical contact between a cable driven transport and a panel to be plated.

With reference now to FIG. 1, a diagrammatic illustration of a first embodiment of a conveyorized spray plating machine of this invention is shown. Spray chamber 10 is formed with the slots 12 at either end to allow for continuous conveyance of panels 11, such as circuit board panels to be plated, to enter and leave the chamber 10. While a circuit board panel is illustrated, it will be understood that any suitable surface of this general geometric configuration which is going to be plated lies within the scope of this invention. One transport mechanism for moving the panel in and out of the chamber is illustrated in schematic form in FIG. 3. As shown in FIG. 1, the panel is supported for moving in the direction of the arrow by small diameter idler rollers 14. The series of roller brushes 13 is positioned to contact the upper and lower surfaces of the panel 11, with a series of anodes 15 positioned to contact the roller brushes on the side of the rollers away from the panel. The anodes 15 are formed of an appropriate metal, for example copper when the panel surface is to be plated with copper. Copper anodes 15 are positioned so that they touch the upper set of rollers 13 from above, and touch the lower set of rollers 13 from below. All of the anodes 15 are connected electrically in parallel to the positive terminal of dc power supply 16. The negative terminal of this power supply 16 is connected to the panel 11 that is to be plated. Spray jets 17 which are connected to a supply of electrolyte are arranged to spray electrolyte solution down, not only onto the anodes 15 and the brushes 13, but also directly onto the panel 11 between the brushes 13. While the transport mechanism for moving the panels horizontally through the chamber is not illustrated in FIG. 1, one such transport is illustrated in FIG. 3 and another in FIG. 4. In general, it is a conveyor-type mechanism which provides for continuous movement of the panel through the chamber while maintaining electrical contact between the negative pole of the power supply 16 and the panel 11 itself.

The roller brushes 13, in one embodiment, have a plastic inner cylindrical core of approximately two inches in diameter and nine inches in length to which is attached a soft outer layer 22 of light, porous (fluffy) material formed of polyester or the like. An example of such a roller is a paint roller. Other forms of porous material may be employed, including, for example, fine bristle brush material and the like. Typical dimensions for roller brushes 13 separations are six inches. The space between the rollers allows for the direct impingement of the electrolyte spray onto the panels 11. It is key to the function of the rollers 13 that the outer coat is sufficiently porous and absorbent so that it retains sufficient electrolyte to provide a continuing electrically conductive path from the anodes to the panels being plated. With this arrangement, the electrolyte can carry sufficient electric current from the anode to the negatively connected panel so that a sufficiently high ionic current is provided to produce a relatively dense electroplating action. The electrolyte fluid is stored in a sump and sprayed under pressure against the roller brushes 13 and the panel to be plated. Spray nozzles 17 may either be stationary or may be oscillated back and forth in either direction.

The plating current is established on the basis of 20 amperes per square foot, which is the value employed in conventional tank plating. It is believed that significantly higher current densities can be used to effect a reduction in the plating times with the present invention. While the embodiment of FIG. 1 is shown with a single power supply connected in parallel to each of the anodes 15, it may be preferable to have separate power supplies connected to the individual anodes 15 to control the current and thus the plating density at different points of travel of panel 11 through the chamber 10.

The electrolyte fluid can be any suitable standard fluid matched to the particular metal being plated. For example, when copper is being plated, a standard copper sulfate plating solution may be employed. Such a solution consists of:

| | |
|---|---|
| Copper sulfate | 8–12 oz./gal. |
| Sulfuric acid | 25–28 oz./gal. |
| Chloride | 50–75 ppm |
| Copper gleam brightener | |

Figure 1A:
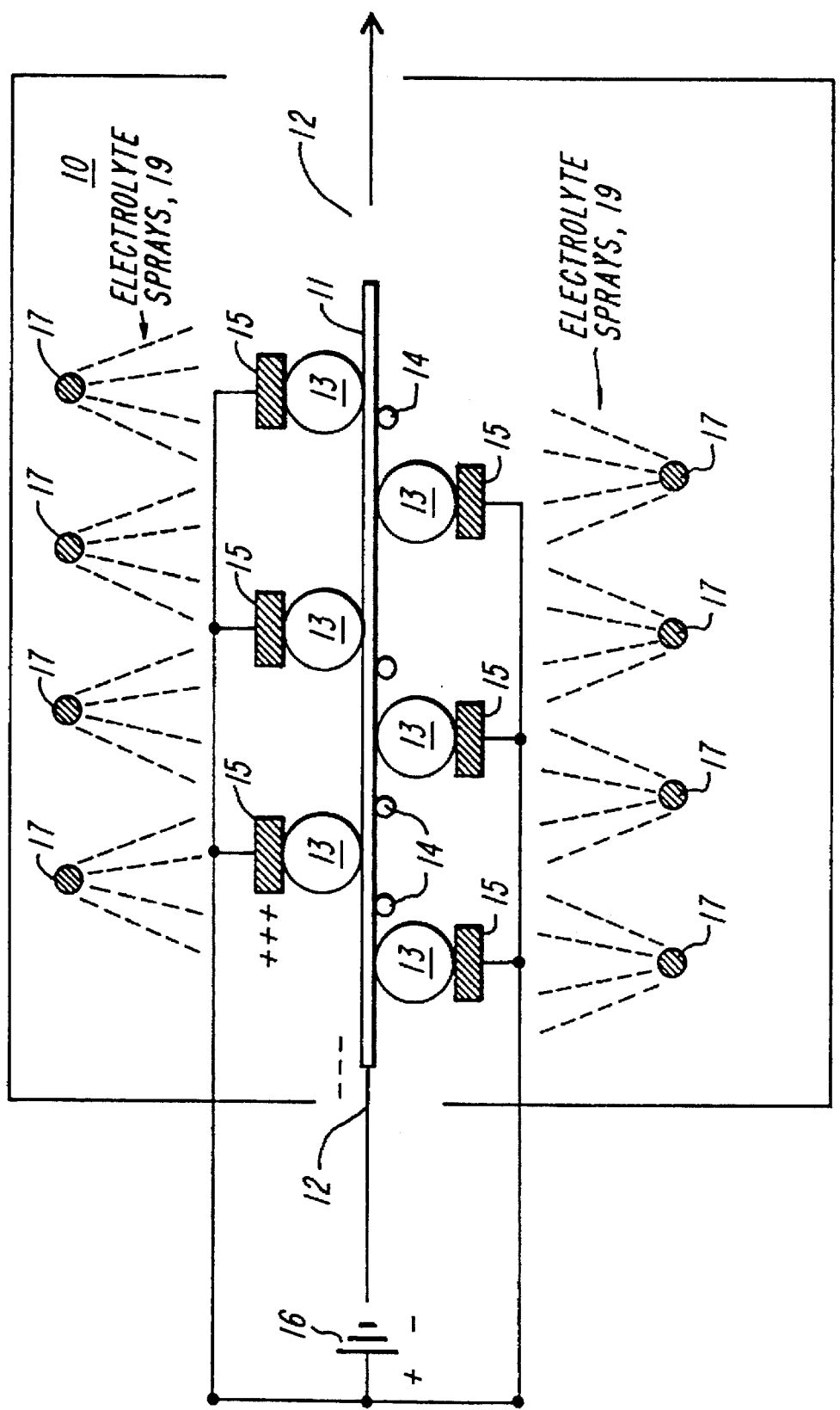
FIG. 1a is a generally diagrammatic illustration of the interior of a spray plating chamber constructed in accordance with the principles of this invention.

While in the configuration shown in FIG. 1a, rollers and anodes are positioned to contact both the upper and lower surfaces of the panel 11, operation can be achieved with only the bottom brushes in place, with copper anodes and electrolyte spray below these brushes as well as above the top surface. In this instance the plating efficiency at the top surface may be somewhat reduced. Contrarily, brush rollers can be provided only on top in which case greater plating efficiency on the top will occur.

Figure 1B:
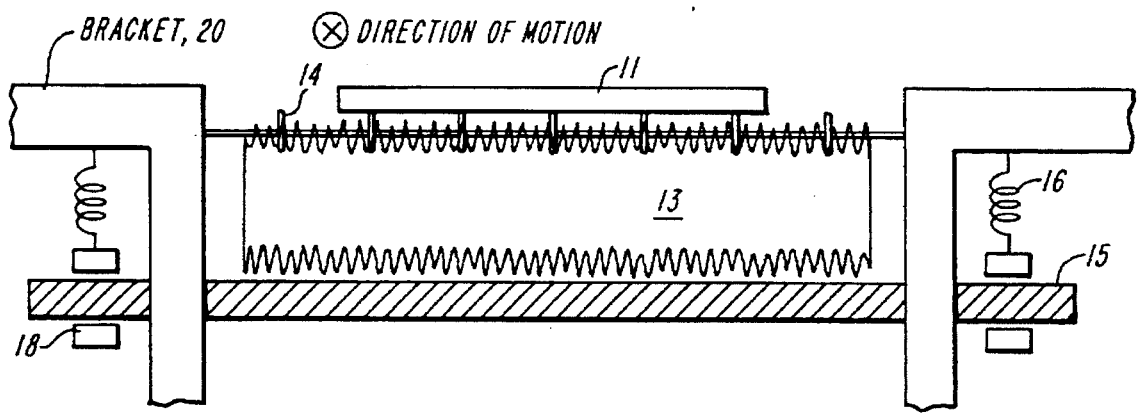

FIG. 1b shows greater detail of how the anodes are supported in the machine. The anode 15 is in the form of a bar that spans the full width of the machine and is able to ride up and down by virtue of slots in a bracket 20 mounted on the machine frame. Springs 16 are made of a suitable material such as stainless steel or titanium which would be impervious to any erosion by the sprayed electrolyte, and provide pressure against the anodes 15 so that the latter remain in contact with the brush rollers 13. In the case of the top rollers, the weight of the anodes will require little or no spring force to accomplish this; in the case of the bottom rollers, a larger spring force will be required. All that is necessary is that the anodes always remain in contact with the fluffy surface of the brush rollers. This contact must be maintained even as the anodes are depleted during use. (If chemistry that uses non-depleting anodes is employed—which is possible but has not been tested in tests done on this machine to date—then no weight changes in the anodes will take place during operation.)

Figure 2B:
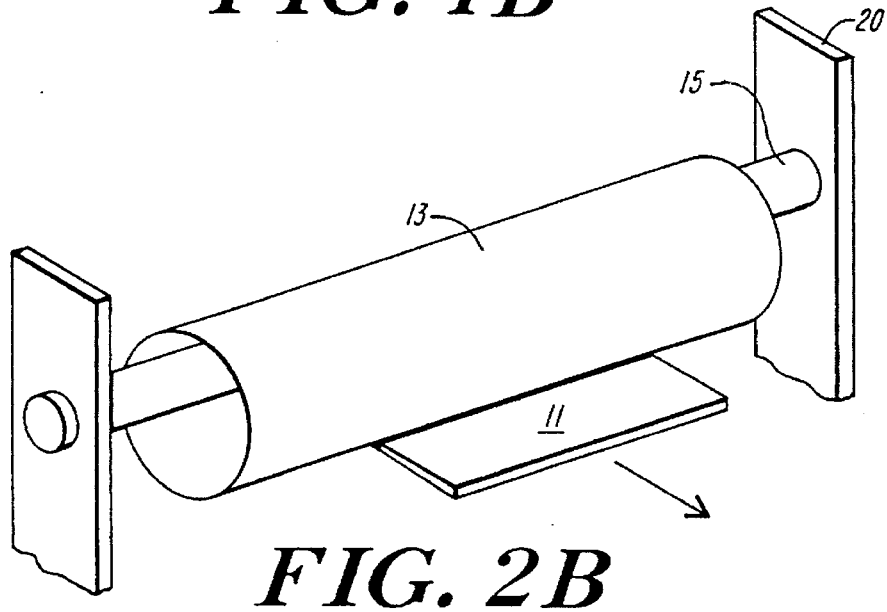
FIGS. 2a, 2b and 2c are illustrations of alternative embodiments of the brush and anode configuration of a spray plating chamber and transport apparatus as illustrated in FIG. 1.
Figure 2A:
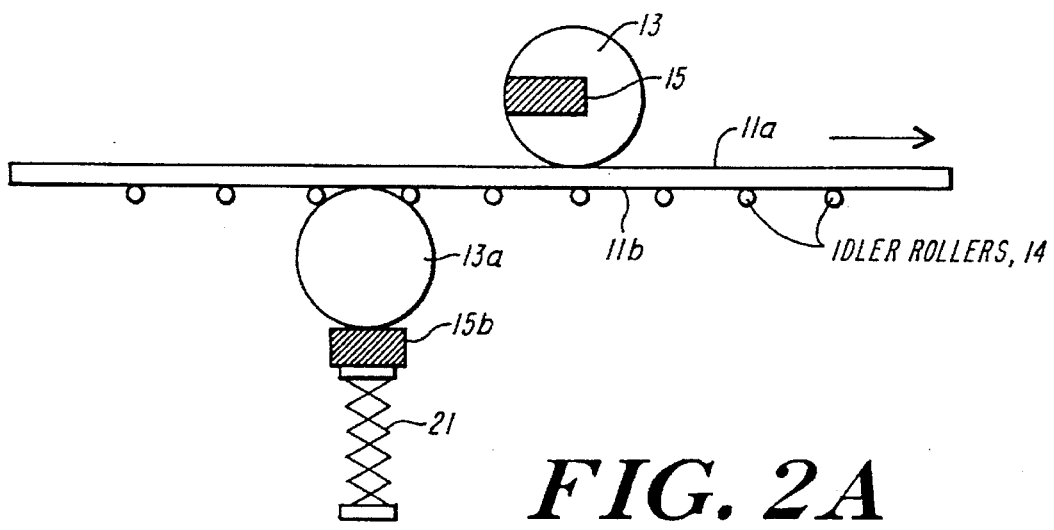
Figure 2C:
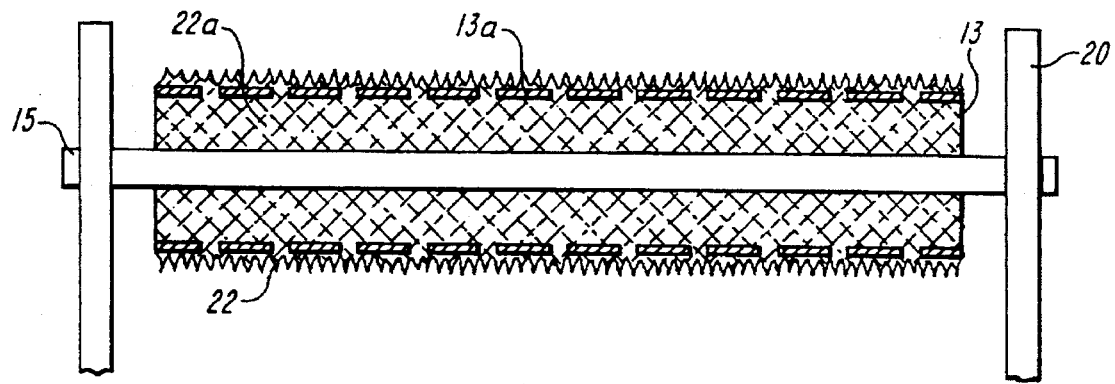

FIGS. 2a, 2b and 2c illustrate alternative embodiments to that of FIG. 1. In the embodiment of FIG. 2a, anode 15 is included within the core 13a of the brush roller 13. In this configuration, the core 13a of the brush roller is made porous, or formed with holes or slots so that electrolyte solution can pass through the outer cover 22 of the brush 13 and make contact with the internally mounted anode 15. FIG. 2c is a cross-sectional illustration of a brush roller 13 containing the internally mounted anode. In the configuration of FIG. 2a, brush roller 13a below the panel 11 contacts the lower surface 11b of the panel under the influence of a compression spring 21 mounted to apply force against the external anode 15a to pressure the brush roller 13a against the bottom surface 11b of the panel.

The configuration of FIG. 2 with anodes inside the brush rollers can be constructed in various ways. Two methods are shown in FIGS. 2b and 2c. One method—depicted in FIG. 2b—allows the brush roller to "float" around the anode bar, the latter again running the full width of the machine and fixed to parts of the machine frame at their ends. As the panels 11 pass through the machine the friction between the panel surface and the brush roller 13 whose weight bears upon the moving panels will cause the floating brush rollers to move in the direction of motion of the panels until it gets stopped by the internal anode 15. As long as the brush roller cores 13a in this configuration are porous or contain numerous holes there will be a continuous path of electrolyte from anode through the brush roller fluff and to the panel. The method of FIG. 2b is most appropriate for top rollers; use of this method for bottom brush rollers would require a spring mechanism to provide appropriate upward pressure of the brush roller against the panel.

FIG. 2c shows a fixed non-floating arrangement of anode 15 and brush roller 13. Again, the brush roller core 13a must be porous so as to allow electrolyte to move freely from inside to outside. The internal portion of the brush roller is filled with fluff 22a (the latter is in all cases made of a soft, water-holding material impervious to attack by the sprayed electrolyte) so that despite anode wear a continuous conductive path from anode to panel exists via the brush roller fluff. If non-depleting anodes are used wear is again not an issue. In both instances the ends of the anode bars are either fixed to portions of the machine frame 20 at the anode ends or else are spring loaded as in FIG. 2b.

Figure 4:
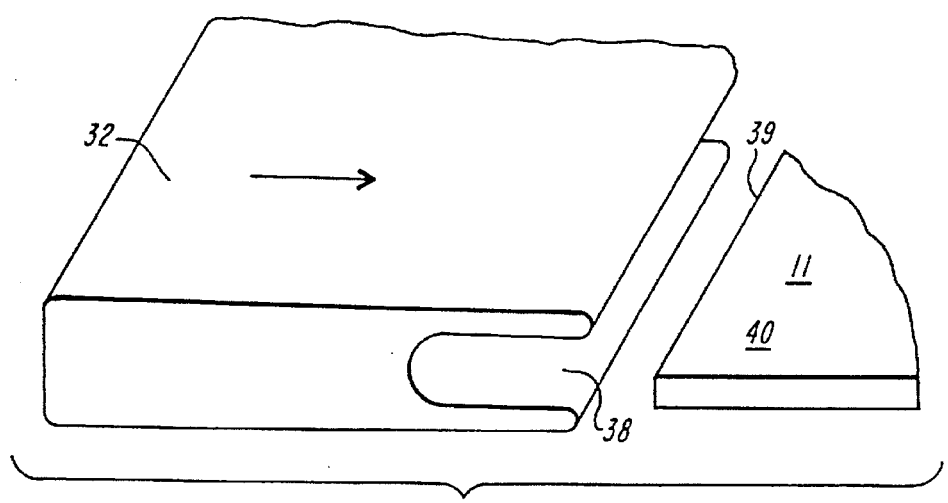
FIG. 4 is a detailed illustration of an alternative apparatus for providing transport motion and electrical contact directly to the panel illustrated in FIGS. 1 and 2.

FIGS. 3 and 4 illustrate specific arrangements for establishing electrical contact to the panels 11 while at the same time providing for linear movement of the panels in the direction of the arrow.

As illustrated in FIG. 3, a moving conductive conveyor chain 29 (or two parallel chains to prevent any rotation of the panels) uses an attached conductive hook on pusher bar 27 to connect the edge of the panels to the electrical power source as the panels move out pushed by the hooks 27 through the chamber 10. Electrical current is carried to the pusher bar by an electrically conductive cable 29 as shown in FIG. 3a. The same cable can be used to drive the pusher bar or else a totally separate drive cable or chain can be used. Frictional drag of the brush rollers 13, illustrated in FIGS. 1 and 2, provides sufficient back force against the conveyor chain pusher bars to ensure a good electrical contact between the bar 27 and panel 11. This back pressure can be monitored through the use of a feedback loop which monitors the plating current thereby ensuring that sufficient electrical contact is maintained. In this arrangement the conductive chain would, of course, be electrically connected to the negative potential of the power supply 16. Various configurations of the bar 27 may be constructed which would improve the surface electrical contact between it and the panel 11. In a configuration of the type illustrated in FIG. 3, the rollers 13 may be segmented across their length to provide an open slot for the connecting bar 27 to pass as the panel moves through the chamber so that the hook does not interfere with the action of the brush rollers.

In the embodiment of FIG. 4, a pusher bar 32 performs the function of moving the panels 11 through the chamber and maintaining the electrical contact. The axis of the pusher bar 32 is parallel to that of the roller brushes and is connected to the negative terminal of the power supply by means of a conductive strap (not shown). The conductive strap is formed as an endless conductive belt which forms its electrical connection to the power supply 16 by the use of an electrical brush pressed against it. This electrical brush should be mounted outside of the chamber 10, although its location within the spray chamber will work as well.

FIG. 4 shows the detail of the pusher bar. It is in the form of a bar with a scooped out edge—recess 38—wide enough to capture the panel thickness as the pusher bar is driven against the panel so as to cause the latter to move through the machine. The concave recess 38 of the pusher bar 32 is big enough to accommodate the thickness panels to be plated and deep enough to assure contact between the pusher bar and panel either at the panel edge 39 or on its top or bottom surface 40. The entire concave surface of the pusher bar is electrically conductive so as to be able to carry electrical current from the attached power supply 16 to the panel. An additional factor determining the depth of the concave recess of the pusher bar is to provide assurance that the panel 11 is positively captured. The back pressure of the top and bottom brush rollers 13, through friction against the moving panel, assures contact between pusher bar and panel. In practice, from tests carried out in the machine built, as long as the pusher bar moves the panel so that there is clear mechanical contact between the two there will also be electrical contact good enough to complete the desired electroplating process. In tests done to date the depth of the concavity in the pusher bar was approximately 0.250" and the width of the scoop roughly 0.150".

In order to maintain the pressure against the panels by the pusher bar, in one configuration the roller brushes 13 rotate in a clockwise direction above the panel and counterclockwise below the panel thereby applying force to the panel in the direction back toward the pusher bar 32. A similar rotational drive could be applied to the idler rollers 14.

Of course other configurations to transport the panels 11 through the chamber and maintain an electrical contact may be employed. Arrangements could include a mechanical clamp at the end of the panel, to either push the panel through the chamber or, alternatively, to pull it through the chamber. The conveyor mechanism and contacting means, whether it be a hook as illustrated in FIG. 3, or a pusher bar as in FIG. 4, will tend to undergo a build-up of plated metal. This build-up of plated metal can be removed either chemically or (by reverse plating) electrochemically, in the return path of the conveyor or mechanical connector after the panels 11 themselves have passed out of the chamber 10. The build-up of plated metal is easier to remove from a pusher bar of the type described than from a mechanical clamp.

We claim:

1. An apparatus for spray plating metal onto a first surface of panel moving in a first direction through a plating chamber comprising, a conveyor for carrying said plate in said first direction through said plating chamber, a series of spray nozzles distributed within said plating chamber in said first direction for dispensing electrolyte droplets onto said panel, a first series of roller brushes within said plating chamber extending in a direction normal to said first direction and parallel to said panel, said brushes adapted for being in rolling contact with one surface of said panel, said roller brushes being positioned to be continuously wet by electrolyte from said nozzles.

a series of metallic anodes physically contacting said roller brushes.

an electrical power source for maintaining said panel at a fixed potential and said anodes at a positive potential with respect to said fixed potential.

2. An apparatus in accordance with claim 1 wherein a second series of spray nozzles and anodes are adapted for being positioned opposed to a second surface of said panels as they move through said plating chamber.

3. An apparatus in accordance with either of claims 1 or 2 wherein said anodes are formed of copper.

4. An apparatus in accordance with claim 2 wherein said first series of rollers have a hollow cylindrical core having a porous cylindrical wall, and wherein said anodes are free to move within said core while maintaining electrical contact with said core walls.

5. An apparatus in accordance with claim 4 wherein said second series of anodes are urged into pressure contact with said second set of rollers by a spring for maintaining contact between said panel surfaces and said first and second set of rollers.

6. An apparatus in accordance with either of claims 2 or 4 and further including a series of idler rollers enabling support of said panels as they are conveyed in said first direction, said idler rollers and the means for supporting them being electrically non-conductive.

7. An apparatus in accordance with claim 2 wherein said conveyor is adapted to engage said panels to provide said movement in said first direction, while simultaneously enabling provision of a direct electrical contact with said panels.

8. An apparatus in accordance with claim 1 wherein said transport apparatus is formed with a conveyor chain moving in said first direction and formed of an electrically conducting material providing an electrical connection to said electrical power source and a mechanical connector means coupled to said conveyor and positioned to provide mechanical force against said panel when in place to move it in a first direction while enabling an electrical connection between said panel conveyor.

9. An apparatus in accordance with claim 1 wherein said transport apparatus is formed with a pusher bar, said pusher bar being arranged to have a recess therein enabling a fit against at least one edge of said panel, said pusher bar being electrically connected to said power source and mechanically driven to be enabled to push said panel in said first direction, while maintaining electrical contact with said panel.

10. An apparatus in accordance with claim 9 wherein said roller brushes are rotated in the direction enabling provision of a frictional drive on said panel surfaces, urging said panel into firm mechanical and electrical contact with said pusher bar and wherein said pusher bar includes a mechanical connection to a conveyor means for urging said pusher bar in said first direction.

* * * * *